US006282606B1

(12) United States Patent
Holland

(10) Patent No.: US 6,282,606 B1
(45) Date of Patent: Aug. 28, 2001

(54) DYNAMIC RANDOM ACCESS MEMORIES WITH HIDDEN REFRESH AND UTILIZING ONE-TRANSISTOR, ONE-CAPACITOR CELLS, SYSTEMS AND METHODS

(75) Inventor: Wayland Bart Holland, Dallas, TX (US)

(73) Assignee: Silicon Aquarius, Inc.

( * ) Notice: Subject to any disclaimer, the term of this patent is extended or adjusted under 35 U.S.C. 154(b) by 0 days.

(21) Appl. No.: 09/285,869

(22) Filed: Apr. 2, 1999

(51) Int. Cl.[7] .............................. G06F 12/00; G06F 13/00; G11C 16/04; G11C 7/00; G11C 8/00
(52) U.S. Cl. ........................ 711/105; 365/233; 365/202; 365/222; 365/189.04
(58) Field of Search ........................ 711/105; 365/189.05, 365/222, 207, 230.05, 189.04, 149, 233

(56) References Cited

U.S. PATENT DOCUMENTS

| 4,829,484 | * | 5/1989 | Arimoto | 365/222 |
| 5,007,022 | * | 4/1991 | Leigh | 365/189.04 |
| 5,511,033 | * | 4/1996 | Jung | 365/222 |
| 5,627,791 | * | 5/1997 | Wright et al. | 365/222 |
| 5,724,296 | * | 3/1998 | Jang | 365/222 |
| 5,778,237 | * | 7/1998 | Yamamoto et al. | 395/750.04 |

\* cited by examiner

*Primary Examiner*—Do Hyun Yoo
*Assistant Examiner*—Kimberly McLean
(74) *Attorney, Agent, or Firm*—James J. Murphy; Winstead Sechrest & Minick

(57) ABSTRACT

Memory 200 having an array of rows and columns of memory cells, each column associated with a pair of complementary bitlines 302a, 302b. An access sense amplifier 203 coupled to each pair of complementary bitlines 302a, 302b for sensing and latching data from cells along a selected row during a first portion of a random access cycle. Refresh sense amplifier 204 is coupled to each pair of complementary bitlines for 302a, 302b for refreshing data from cells along a selected row during a second portion of the random access cycle.

12 Claims, 3 Drawing Sheets

DYNAMIC RANDOM ACCESS MEMORIES WITH HIDDEN REFRESH AND UTILIZING ONE-TRANSISTOR, ONE-CAPACITOR CELLS, SYSTEMS AND METHODS

TECHNICAL FIELD OF THE INVENTION

The present invention relates in general to electronic memories and in particular to dynamic random access memories with hidden refresh and utilizing one-transistor, one-capacitor cells, and systems and methods using the same.

BACKGROUND OF THE INVENTION

Dynamic random access memory (DRAM) is the principal type of memory used in most applications such as personal computers (PCS). When compared, for example, to static random access memory (SRAM), DRAM is less expensive, consumes substantially less power, and provides more bits in the same chip space (i.e. has a higher cell density). DRAM is normally used to construct those memory subsystems, such as system memories and display frame buffers, where power conservation and high cell density are more critical than speed. In most computing systems, it is these subsystems which dominate the system architecture, thus making DRAM the prevalent type of memory device on the market.

Notwithstanding these significant advantages, DRAMs are also subject to significant restraints due to the manner in which they must be constructed and operated. Specifically, since each cell stores data as charge on a capacitor (i.e. charged to a predetermined voltage for a logic 1 and discharged to approximately 0 volts for a logic 0), the length of time a bit, and in particular a logic 1 bit, can be stored in a given cell is a function of the ability of the capacitor to retain charge. Charge retention, and consequently data integrity is in turn a function of charge leakage.

Almost all DRAMs maintain data integrity through the periodic refresh of the memory cells storing logic 1 data, which has deteriorated in voltage as charge has leaked off the capacitor, back to the full logic 1 storage voltage. This is essentially done by performing read operations to the cell array on a row by row basis (the latching and restore functions of the sense amplifiers returning all voltages to their original levels). Depending on the refresh scheme, all the rows in the array or subarray may be refreshed by stepping though the rows in a single sequence or by distributing the refresh of smaller groups of rows of the array between read and write operations.

In the system environment, the need to refresh the system DRAM presents some substantial problems. In particular, during the period in which the DRAM is being refreshed, the processor, core logic, or controller managing the given memory, locks out all accesses to the memory from anywhere in the system. While the timing of the precharge period can be adjusted, for example by the CPU, to meet overall system needs, the maximum period between refreshes for a given device cannot be exceeded without the risk of data loss.

If the refresh can be "hidden", the interface between the DRAM and the remainder of the system will emulate that of an SRAM. In other words, the system, with proper timing, can perform a continuous sequence of accesses to memory without periodic interruption for refresh. Given the criticality of the problem of refresh, a need has arisen to find efficient means of hiding refresh.

SUMMARY OF THE INVENTION

The present inventive concepts are embodied in a memory including an array of rows and columns of memory cells, with each column associated with a pair of complementary bitlines. An access sense amplifier is coupled to each pair of the complementary bitlines for sensing and latching data from cells along a selected row during a first portion of a random access cycle. A refresh sense amplifier is coupled to each pair of the complementary bitlines refreshing data from cells along a selected row during a second portion of the random access cycle.

An additional embodiment of these concepts is a memory system including a memory comprising an array of rows and columns of memory cells, with each column associated with a pair of complementary bitlines and first and second sense amplifiers coupled to each of the pairs of bitlines. Memory control circuitry from the first part of a random access cycle accesses selected cells in the array using the first sense amplifiers and during a second part of the random cycle uses the second sense amplifiers to refresh selected cells in the array.

A method is also disclosed for operating a dynamic random access memory using an array of memory cells arranged in rows and columns, with each column associated with a pair of complementary bitlines. During a first part of a random access cycle, data are sensed and latched from selected cells in the array using a first set of sense amplifiers coupled to the complementary pairs of bitlines. First set of sense amplifiers are isolated and the pairs of complementary bitlines precharged. During a second part of the random cycle, selected cells in the array are refreshed using a second set of sense amplifiers coupled to the complementary pairs of bitlines.

The present inventive concepts allow for read and refresh. Thus, the memory can be accessed on a continuous basis without interruption for refresh. In other words, a DRAM is provided having an SRAM-type interface to the processing components of the computing system.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1A:
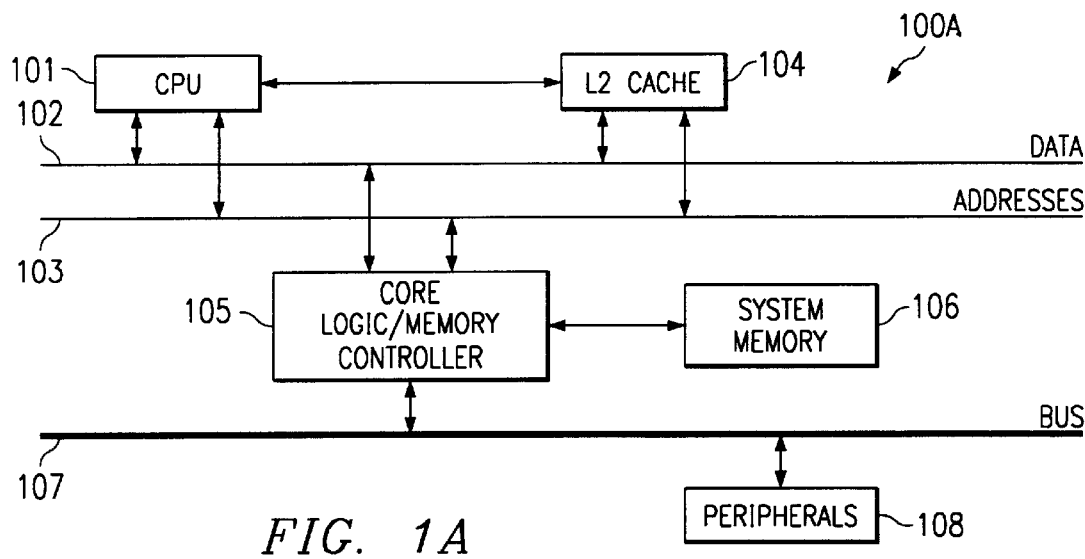
FIGS. 1A and 1B are block diagrams respectively depicting two basic system architectures typical of those found in personal computers.
Figure 1B:
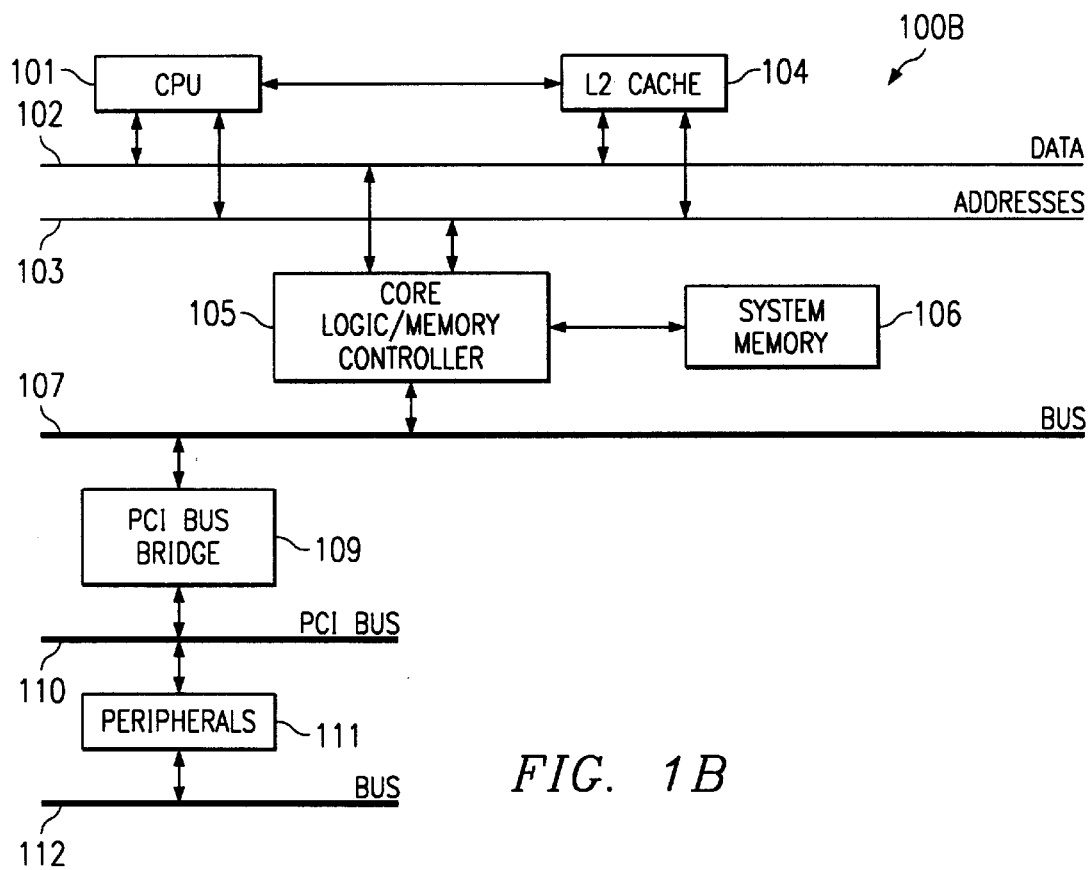

FIGS. 1A and 1B are block diagrams respectively depicting two basic system architectures 100A and 100B typical of those found in personal computers (PCS). While numerous variations on these basic architectures exist, FIGS. 1A and 1B are suitable for describing the basic structure and operation of most PCS. Both systems 100A and 100B include a single central processing unit 101, CPU local data bus 102, CPU local address bus 103, external (L2) cache 104, core logic/memory controller 105, and system memory 106. In system 100A, the peripherals 108 are coupled directly to core logic/memory controller 105 via a bus 107. Bus 107 in this case is preferably a peripheral controller interface (PCI) bus, although alternatively it could be an ISA, general, or special purpose bus, as known in the art. In system 100B, core logic/memory controller 105 is again coupled to bus 107. A PCI bus bridge 109 then interfaces bus 107 with a PCI bus 110, to which the peripherals 111 couple. An additional bus 112, which may be a ISA, PCI, VESA, IDE, general, or special purpose bus, is provided for access to peripherals 111 from an external device or system (not shown).

In single CPU systems 100A and 100B, CPU 101 is the "master" which, in combination with the operating system and applications software, controls the overall operation of system 100. Among other things, CPU 101 performs various data processing functions including numerical and word processing, generates graphics data, and performs overall system management. CPU 101 may be for example a complex instruction set computer (CISC), such as an Intel Pentium™ class microprocessor, a reduced instruction set computer (RISC), such as a Apple PowerPC™ microprocessor, or a very long instruction word (VLIW) machine.

CPU 101 communicates with the remainder of system 100 via CPU local address and data buses 102 and 103, each of which may be for example a special bus, or a general bus, as known in the art.

Core logic/memory controller 105, under the direction of CPU 101, controls the exchange of data, addresses, control signals and instructions between CPU 101, system memory 105, and peripherals 108/111 via bus 107 and/or PCI bus bridge 109. Although the core logic/memory controller allows tasks to be shifted from the CPU, thereby allowing the CPU to attend to other CPU-intensive tasks, the CPU can always override core logic/memory controller 105 to initiate execution of a higher priority task.

Core logic and memory controllers are widely available in the PC industry and their selection and application are well known by those skilled in the art. The memory controller can be either a separate device or incorporated into the same chip set as the core logic. The memory controller is generally responsible for generating the memory clocks and control signals such as SCLK (System Clock) /RAS, /CAS, R/W and bank select, and monitors and controls cell refresh. The memory controller may also have some address generation capability for accessing sequences of pages.

The core logic is typically comprised of a chip-set, with one or more chips typically being "address and system controller intensive" and one or more chips typically being "data intensive." Among other things, the address intensive chip(s): interfaces CPU 101 with address bus 103; maintains cache coherency, including the cache tags, set associative cache tags and other data necessary to insure cache coherency; performs cache "bus snooping"; generates the control signals required for DRAMs in the system memory or cache; and controls general management transactions. The data intensive chip(s) generally: interfaces CPU 101 with the data bus 102; issues cycle completion responses; may abort operations if their cycles are incomplete; and arbitrates for the data path of bus 102.

CPU 101 can directly communicate with core logic/memory controller 103 or through an external (L2) cache 104. L2 cache 104 may be for example a 256 KByte fast SRAM device(s). Typically, the CPU also maintains up to 16 kilobytes of on-chip (L1) cache.

PCI bus bridges, such as PCI bus bridge 109, are also well known to those skilled in the art. In the typical PC, the CPU is the bus master for the entire system and hence devices such as PCI bus bridge are slave devices which operate under command of the CPU.

Peripherals 108/111 may include a display controller and associated frame buffer, floppy drive controller, disk driver controller, and/or modem, to name only a few options.

Figure 2:
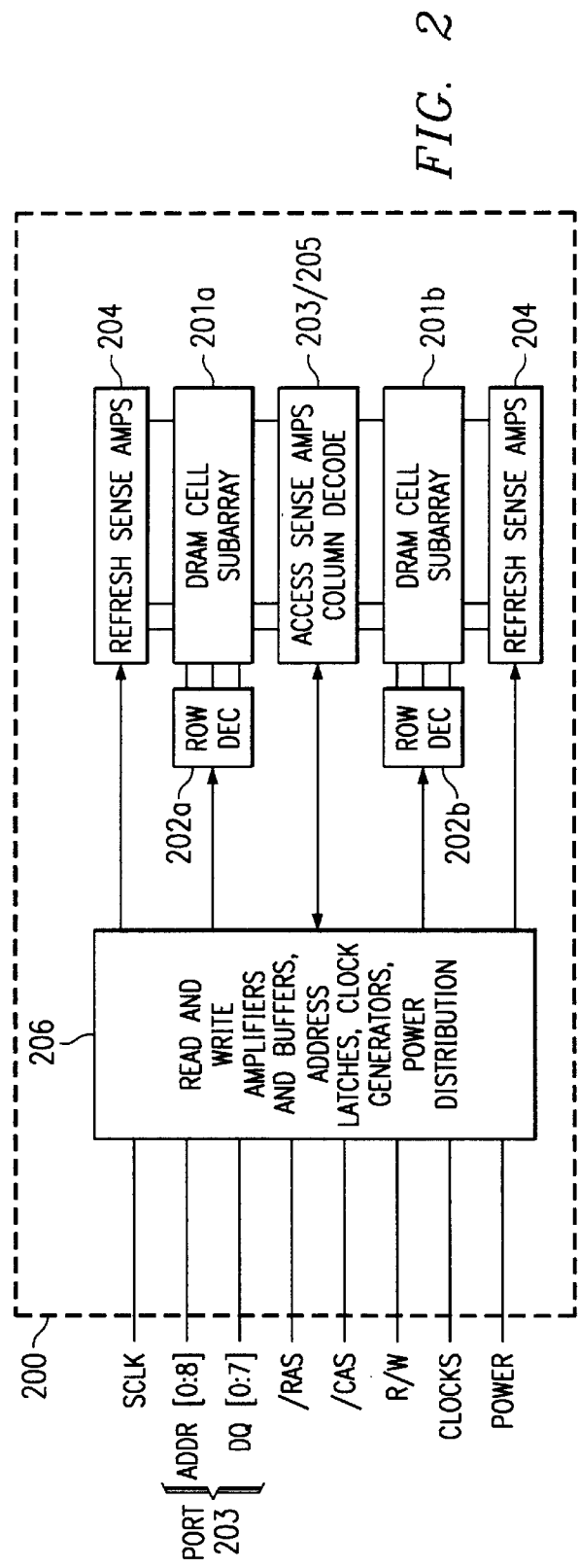
FIG. 2 illustrates a high level functional block diagram of a memory embodying the principles of the present invention.

FIG. 2 is a high level functional block diagram of a DRAM memory 200 embodying the teachings of the present invention. Memory 200 is suitable for such applications as system memory 106 in either of the exemplary processing environments shown in FIGS. 1A and 1B. Many other applications of memory 200 are possible as will become apparent.

Memory 200 includes an array 201 organized as a pair of subarrays 201a and 201b (collectively array 201), each composed of rows and columns of DRAM cells. Each row of cells is associated with a conductive wordline and each column of cells is associated with a conductive bitline. According to the principles of the present invention each bitline is associated with an access sense amplifier 203 and a refresh sense amplifier 204. This will be discussed in detail later.

Generally, during an access, a row of cells in array 201 is selected in response to a received row address by one of the row decoders 202a or 202b. Specifically, in response to the row address the given decoder activates (typically brings to a predetermined positive voltage) the conductive wordline associated with the addressed row. The activation of the wordline turns on all the cells of the selected row. Then, data is input to or output from, selected cells along the selected row through the bitline associated with the corresponding columns through the column decoder 205 in response to a received column address. In the page or burst modes, additional column addresses are generated internally to access additional locations from the active row.

The two primary operations, reads and writes, can now be more particularly described. During a read, the data from the entire active row of cells are sensed and latched by access sense amplifiers 203. Column decoder in response to column addresses then controls the passage of data from the sense amplifiers to the device read amplifier (block 206). During a write, data are transferred to the locations addressed by the column address along the active row by the write buffers (block 206) directly through access sense amplifiers 203 (the data in sense amplifiers 203 are essentially written over).

In the illustrated embodiment, the data passed by sense amps 203 are selectively input to or output from device 200 through Z number of access data input/output lines (DQ [0:Z]) in response to row and column addresses received at Y number of corresponding multiplexed access address lines (ADD[0:Y]). Collectively, the access data lines and the access address lines comprise access port 205.

Row addresses are latched into address latches within block 206 through the multiplexed address lines on the falling edge of external /RAS. At least one column address is similarly latched through the access address lines on the falling edge of external /CAS. External /RAS is also used to time the precharging the bitline associated with each column of cells.

Block 206 generally includes the traditional input/output circuitry, including read and write buffers, and amplifiers, address latches, power distribution circuitry and clock generation circuitry. DRAM 200 is preferably a synchronous DRAM, and therefore operates off of a synchronous DRAM master clock (SCLK) which controls the overall timing.

Figure 3:
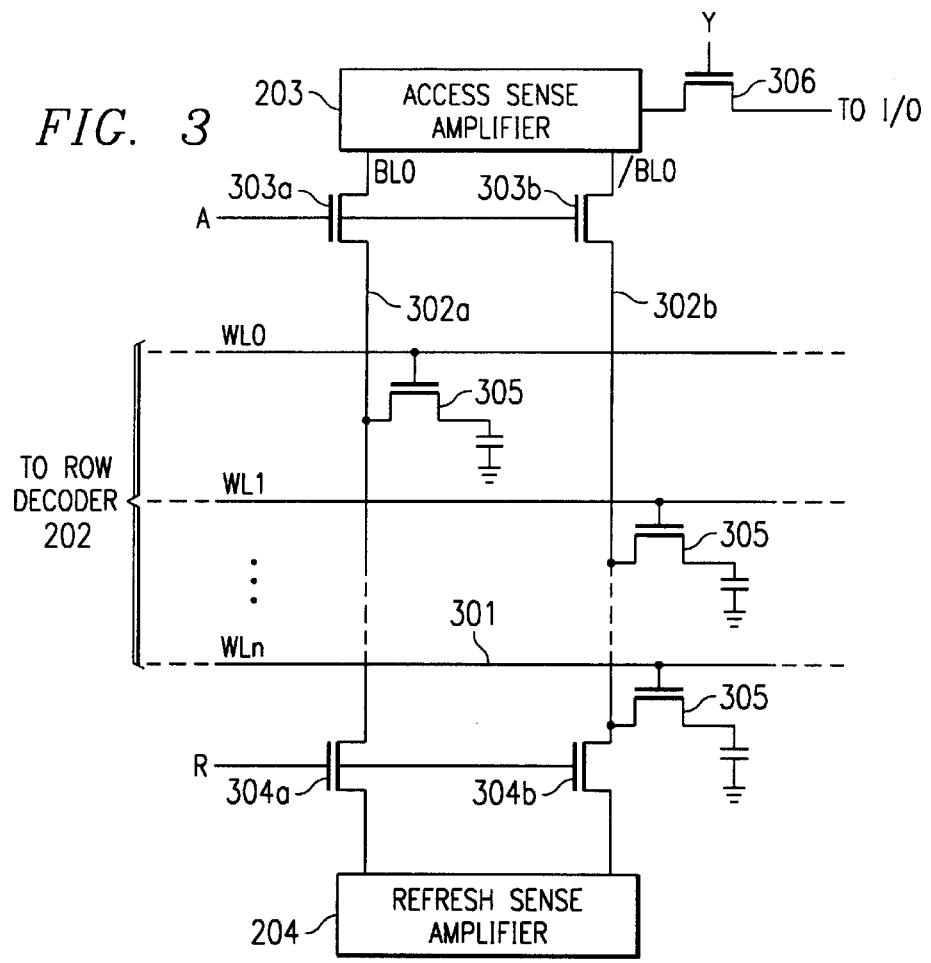
FIG. 3 is a diagram of selected portions of the memory illustrated in FIG. 2.

FIG. 3 depicts an exemplary pair of complementary bitlines BL0 and /BL0 (302a and 302b respectively) for column 0 in one of the subarrays 201. (The remaining bitlines in array 201 operate in substantially the same way.) A folded bitline scheme is illustrated for reference, although the same principles will apply to an open bitline scheme. Three wordlines 301 are shown, specifically wordlines WL0, WL1 and WLn. Each complementary bitline pair is coupled to an access amplifier 203 and a refresh sense amplifier 204. Bitlines BL0 and /BL0, couple to access sense amplifier 202 through a pair of transistors 303a and 303b and to refresh sense amplifier 204 through a pair of transistors 304a and 304b. As will be discussed further below, a control signal A turns on transistors 303 only during the active period when cells are being accessed and signal R turns on transistors 304 only during the refresh period. A very small number of DRAM cells 305 in the corresponding subarray are shown for reference. A transistor 306 responsive to a signal on the corresponding Y-line gates data between each access sense amplifier 203 and the memory I/O.

Figure 4:
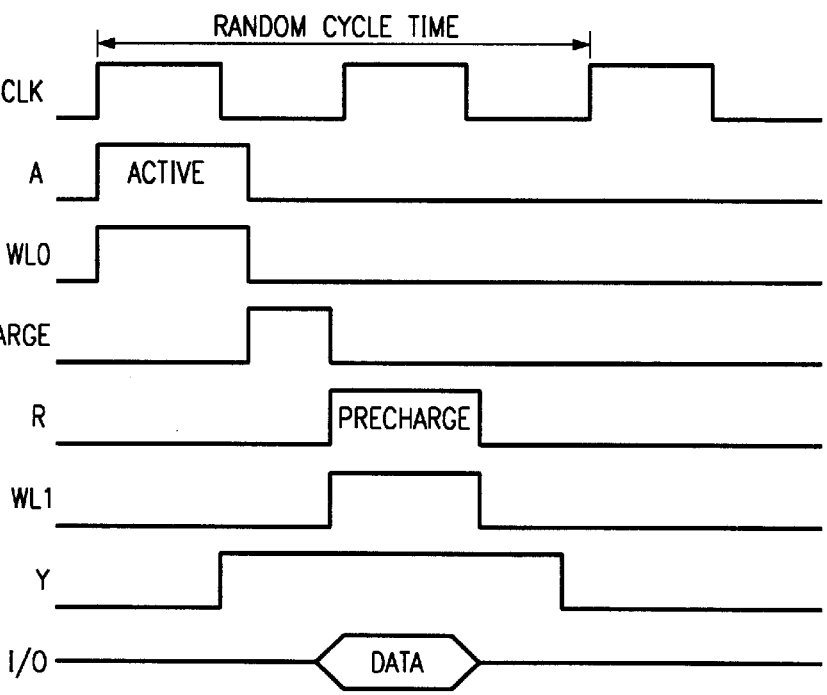
FIG. 4 is an exemplary timing diagram illustrating the operation of the memory shown in FIGS. 2 and 3.

The operation of the circuitry of FIG. 3 is generally described in the timing diagram of FIG. 4. Preferably, the present concepts are employed in synchronous DRAMs operating off of a DRAM synchronous clock (SCLK). For discussion purposes, the Random Cycle Time (i.e. the worst case time between random address access data) is assumed to be two SCLK periods. The timing periods shown in FIG. 4 represent only a few cycles of the much longer waveforms typically found during the continuous operation of memory 200.

On the first depicted rising edge of the clock, an active cycle A begins. Bitlines BL0 and /BL1 are precharged and equalized, and in response to selection by the corresponding row decoder, wordline WL0 is activated. All the cells coupled to WL0 turn-on and their capacitors couple to the corresponding bitlines BL, for example BL0. The voltage change on bitlines BL are then sensed using bitlines /BL (e.g. /BL0) as their complements. The data is latched into access sense amplifiers 203. On the subsequent falling SCLK edge, the Y line activates turning on transistor 306 (FIG. 3) and on the second rising edge of the SCLK, data is clocked out of access sense amplifiers 203 to the memory I/O (block 206).

Shortly after the first depicted falling edge, the active cycle terminates and access sense amplifiers 203 for the accessed subarray are isolated by transistors 303. Bitlines BL and /BL are again precharged and equalized. On the second clock rising edge, the refresh cycle begins, with the activation of a second wordline for a row in the subarray requiring refresh. In this example wordline WL1 is assumed for discussion purposes. Also, in the present example, bitlines /BL0 couple to the cells being refreshed and bitlines BL0 are being used as their complements for sensing purposes. Transistors 304 turn on and refresh sense amplifiers 204 are used to sense and latch the data of the cells along wordline WL1, thereby restoring the data in the cells of row (wordline) WL1 to the appropriate full voltage levels.

According to the inventive concepts, the random access time is now longer than in a conventional DRAM, because for each random cycle, one row is accessed and another row is refreshed. Even though random cycles take longer than typical DRAMs (the random access time and burst rate remain the same), to the remainder of the processing system memory 200 appears as having an SRAM-type interface. In other words, a continuous sequence of accesses can be made to memory 200 at the appropriate clock rate without long periodic interruptions for refresh.

Figure 5:
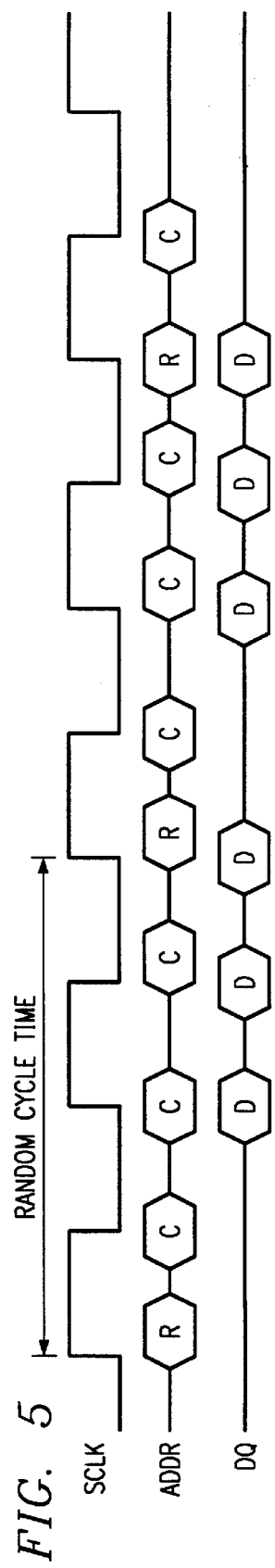
FIG. 5 is an exemplary timing diagram illustrating the operation of the memory of FIGS. 2 and 3 in the system environment.

FIG. 5 is a conceptional timing diagram illustrating the operation of memory 200. In this case, burst/page accesses with a random cycle time of two clock periods are shown for reference. On every third rising edge of the SCLK, a row address (R) is input to the address port. The column addresses are timed off of the following SCLK rising and falling edges. Starting with the second rising edge of SCLK, valid data begins to be clocked out of the access sense amplifiers and are available at the data (DQ) terminals.

As discussed above with regards to FIG. 3, a selected row in the cell array is refreshed starting with the second rising edge of the SCLK. The refresh occurs at the same time data latched in the access sense amplifiers is paged or bursted out. Hence, as shown in FIG. 4, the refresh is hidden to the remainder of the system (e.g. the CPU or the core logic). In other words, the interface between the system and memory 200 emulates an SRAM-type interface.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It is therefore contemplated that the claims will cover any such modifications or embodiment that fall within the true scope of the invention.

What is claimed is:

1. A synchronous memory operating in response to a clock comprising:
   an array of rows and columns of memory cells, each column associated with a pair of complementary bitlines;
   an access sense amplifier coupled to each of the pairs of complementary bitlines for sensing and latching data from cells along a selected row in response to a first edge of the clock initiating a first portion of one clock period of a random access cycle; and
   a refresh sense amplifier coupled to each of the pairs of complementary bitlines for refreshing data from cells along a selected row in response to a second edge of the clock initiating a second portion of one clock period of the random access cycle.

2. The memory of claim 1 and further comprising a transistor associated with each of the bitlines for selectively coupling the bitlines to the access sense amplifiers during the first portion of the random access cycle.

3. The memory of claim 1 and further comprising a transistor associated with each of the bitlines for selectively coupling the bitlines to the refresh sense amplifiers during the second portion of the random access cycle.

4. The memory of claim 1 wherein said memory cells comprise a one-transistor one-capacitor dynamic random access memory cells.

5. The memory of claim 1 wherein the access sense amplifiers are operable to output latched data during the second portion of the random access cycle.

6. A memory system operating in response to a clock comprising:

a memory comprising an array of rows and columns of memory cells, each column associated with a pair of complementary bitlines, and first and second sense amplifiers coupled to each of the pairs of bitlines; and memory control circuitry operable during a first part of a random cycle to access selected cells in the array using the first sense amplifiers and during a second part of the random cycle using the second sense amplifiers to refresh selected cells in the array, the first and second parts of the random cycle are timed by the clock and the random cycle has a random cycle time of two clock periods.

7. The memory system of claim 6 wherein the first part of the random cycle is initiated at the start of a first clock period and the second part of the random cycle is initiated at the start of a second clock period.

8. The memory system of claim 6 wherein the memory control circuitry comprises core logic.

9. The memory system of claim 6 wherein the memory control circuitry comprises a central processing unit.

10. A method of operating a dynamic random access memory having an array of memory cells arranged in rows and columns, with each column associated with a pair of complementary bitlines, the method comprising the steps of:

during a first part of a random cycle initiated by an edge of a first clock period of a clock sensing and latching data from selected cells in the array using a first set of sense amplifiers coupled to the complementary pairs of bitlines;

isolating the first set of sense amplifiers;

precharging the pairs of complementary bitlines; and during a second part of the random cycle initiated by an edge of a second clock period of the clock refreshing selected cells in the array using a second set of sense amplifiers coupled to the complementary pairs of bitlines, the first and second clock periods being consecutive periods in a waveform.

11. The method of claim 10 wherein said step of isolating the first set of sense amplifiers comprises the step of isolating the first set of sense amplifiers from the pairs of bitlines using a transistor.

12. The method of claim 10 wherein said clock defines a random cycle time of two clock periods.

* * * * *